United States Patent
Di et al.

(10) Patent No.: US 9,551,937 B2
(45) Date of Patent: Jan. 24, 2017

(54) GRAPHENE SENSOR AND METHOD OF FABRICATING THE SAME AND TOUCH-SENSITIVE DISPLAY DEVICE

(71) Applicant: BOE TECHNOLOGY GROUP CO., LTD., Beijing (CN)

(72) Inventors: Yunping Di, Beijing (CN); Zhen Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 74 days.

(21) Appl. No.: 14/802,752

(22) Filed: Jul. 17, 2015

(65) Prior Publication Data

US 2016/0202613 A1 Jul. 14, 2016

(30) Foreign Application Priority Data

Jan. 12, 2015 (CN) .......................... 2015 1 0015480

(51) Int. Cl.

| | |
|---|---|
| *G03F 7/42* | (2006.01) |
| *G03F 7/16* | (2006.01) |
| *G03F 7/20* | (2006.01) |
| *G03F 7/32* | (2006.01) |
| *G06F 3/041* | (2006.01) |
| *H05K 1/09* | (2006.01) |

(52) U.S. Cl.
CPC .............. *G03F 7/422* (2013.01); *G03F 7/16* (2013.01); *G03F 7/20* (2013.01); *G03F 7/32* (2013.01); *G06F 3/041* (2013.01); *H05K 1/092* (2013.01); *G06F 2203/04103* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,130,098 A | * | 10/2000 | Handique | ............. B01F 5/0085 366/DIG. 2 |
| 2006/0071303 A1 | * | 4/2006 | Lee | ...................... H01L 21/4846 257/643 |
| 2015/0303065 A1 | * | 10/2015 | Buckalew | ........... H01L 21/0273 438/474 |
| 2016/0103266 A1 | * | 4/2016 | Li | ........................ G02B 6/0036 345/175 |

* cited by examiner

*Primary Examiner* — Van Chow
(74) *Attorney, Agent, or Firm* — Kinney & Lange, P.A.

(57) ABSTRACT

The present disclosure provides a method of fabricating a graphene touch sensor, a graphene sensor and a touch-sensitive display device. The method comprises: forming a graphene layer on a substrate; forming a metal layer on the graphene layer; coating a photoresist layer on the metal layer; exposing the photoresist layer by using a gray-scale reticle and developing the exposed photoresist layer to obtain a photoresist completely removed region, a photoresist partially remained region, and a photoresist completely remained region; removing the metal layer located in the photoresist completely removed region; removing the graphene layer located in the photoresist completely removed region; removing the metal layer located in the photoresist partially remained region; coating a protective film on the graphene layer located in the photoresist partially remained region; striping off the remainder photoresist. The embodiment of the present disclosure avoids the alkaline developing solution and the alkaline stripping solution from contacting the graphene film to degrade the conduction of the graphene, thereby increasing yield and reducing cost.

10 Claims, 4 Drawing Sheets

GRAPHENE SENSOR AND METHOD OF FABRICATING THE SAME AND TOUCH-SENSITIVE DISPLAY DEVICE

CROSS-REFERENCE TO RELATED APPLICATION

This application claims the benefit of Chinese patent application No. 201510015480.3, filed on Jan. 12, 2015 with State Intellectual Property Office of China, and the disclosures of which are incorporated herein in its entirety by reference.

BACKGROUND OF THE INVENTION

Field of the Invention

The present disclosure relates to touch display field, and particularly to a graphene sensor and a method of fabricating the same and a touch-sensitive display device.

Description of the Related Art

Graphene is a flat film constructed by carbon atoms in hexagon-shaped honeycomb crystal lattice with $sp^2$ hybridized orbit (i.e., one s orbit and two p orbits are hybridized), which is one kind of 2D material having a thickness of one carbon atomic monolayer, i.e., 0.335 nm. A monolayer graphene has a light transmission of 97.7%. That is, it has excellent properties such as a high light transmission, a non-reflection, an ultrahigh carrier mobility ($2*10^5$ $cm^2$/Vsec), a high flexibility, a high mechanical strength (tensile strength of 10-20 GPa), a good chemical stability, and a high thermal conductivity. The graphene as a transparent conductive film may be used to fabricate an ultra-lightweight, ultra-thin, high light transmittance and flexible touch screen.

It is a trend to develop a touch screen that has a big size and a narrow frame and is ultra-lightweight and ultra-thin. It is required to fabricate a metal leading wire having a thin line width with a high etching precision, and produce a product with narrow/ultra-narrow frame rim meeting the requirements. However, an existing screen printing technique to directly form a leading wire by a conductive silver paste does not meet the requirement of producing a product with the narrow frame rim. In addition, although a technique of fabricating an ITO touch sensor by etching an Indium Tin Oxide (ITO) film and a metal leading wire through a lithographic approach is a well-known technology that may achieve a high etching precision and high efficiency, the ITO film may be damaged during etching a metal layer. If the ITO film is replaced by graphene, then the graphene film may be not influenced by the corrosion caused by an acid solution during etching the metal, when fabricating the graphene touch sensor and the metal leading wire by the lithography. However, when fabricating a patterned graphene layer by the conventional lithography, an alkaline developing solution and an alkaline stripping solution contact the graphene film and cause the electrical conductivity of the graphene film to be degraded.

SUMMARY OF THE INVENTION

Aiming to the deficiencies in prior art, the present disclosure provides a graphene touch sensor, a method of fabricating the same and a touch-sensitive display device, which avoid the problem that electrical conduction of the graphene film becomes degraded due to its contact to an alkaline developing solution and alkaline stripping solution, and thus increases a yield and reduces cost.

According to an aspect of the present disclosure, there is provided a method of fabricating a graphene touch sensor, comprising:
  forming a graphene layer on a substrate;
  forming a metal layer on the graphene layer;
  coating a photoresist layer on the metal layer;
  exposing the photoresist layer by using a gray-scale reticle and developing the exposed photoresist layer to obtain a photoresist completely removed region, a photoresist partially remained region, and a photoresist completely remained region;
  removing the metal layer located in the photoresist completely removed region;
  removing the graphene layer located in the photoresist completely removed region;
  removing the metal layer located in the photoresist partially remained region;
  coating a protective film on the graphene layer located in the photoresist partially remained region;
  striping off the remainder photoresist.

Preferably, during exposure, if the photoresist is a positive photoresist, the photoresist in the photoresist completely removed region is illuminated while the photoresist in the photoresist completely remained region is not illuminated.

Preferably, during the exposure, if the photoresist is a negative photoresist, the photoresist in the photoresist completely remained region is illuminated while the photoresist in the photoresist completely removed region is not illuminated.

Preferably, the step of removing the metal layer located in the photoresist completely removed region comprises: wet etching the metal layer located in the photoresist completely removed region by an acid solution.

Preferably, the step of removing the graphene layer located in the photoresist completely removed region comprises: dry etching the graphene layer located in the photoresist completely removed region while ashing the photoresist layer in the photoresist partially remained region.

Preferably, the step of removing the metal layer located in the photoresist partially remained region comprises: wet etching the metal layer located in the photoresist partially remained region by an acid solution.

Preferably, the protective film is made by a resin material.

Preferably, the step of striping off the remainder photoresist comprises: striping off the remainder photoresist by an alkaline stripping solution.

According to another aspect of the present disclosure, there is provided a graphene sensor fabricated by the above method, comprising: a substrate, a pattern of a graphene layer formed on the substrate and a metal leading wire formed on the pattern of the graphene layer.

According to a still aspect of the present disclosure, there is provided a touch-sensitive display device, comprising the above graphene sensor.

It can be known from the above technical solutions that the present disclosure provides a graphene touch sensor, a method of fabricating the same and a touch-sensitive display device. It avoids the problem that electrical conduction of the graphene film becomes degraded due to its contact to an alkaline developing solution and an alkaline stripping solution during the lithographic process, by using a gray-scale reticle lithographic technology and a technique of using a metal layer as a lithographic mask film of the graphene layer. In addition, it also increases the yield, and further, renders the technique of fabricating a graphene touch screen by lithography technology to become feasible. Meanwhile, it reduces the number of masks/reticles used in the process and thus reduces the production cost, and facilitates to obtain metal leading wire electrodes with high etching precision for product with a narrow/ultra-narrow frame.

BRIEF DESCRIPTION OF THE DRAWINGS

In order to describe embodiments of the present invention or technical solutions in the prior art more clearly, accompanying drawings required for illustrating the embodiments or the prior art will be simply explained as below. Apparently, the accompanying drawings for the following description are only some embodiments of the present invention. Those skilled in the art also could derive other accompanying drawings from these accompanying drawings without making a creative work.

DETAILED DESCRIPTION OF PREFERRED EMBODIMENTS OF THE INVENTION

Figure 1:
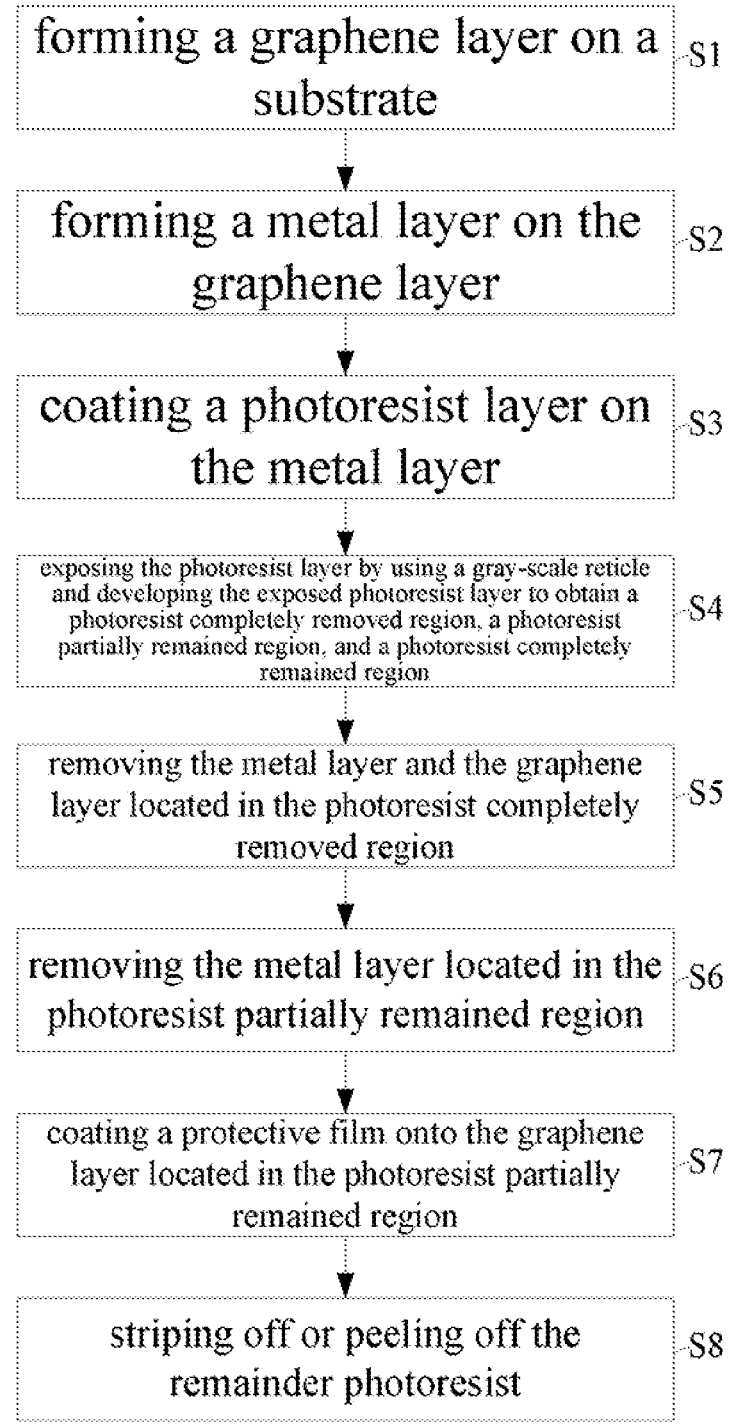
FIG. 1 is a schematic flow chart of a method of fabricating a graphene sensor according to an embodiment of the present disclosure.

A thorough and complete description of technical solutions of embodiments of the present disclosure will be made as below with reference to the accompanying drawings. Apparently, the embodiments set forth herein merely are some, but not all, of the embodiments of the present disclosure. On the basis of these embodiments set forth herein of the present disclosure, all other embodiments which are made without involving any inventive steps by those skilled in the art should be included within the scope of the present disclosure.

It is noted that a size of a layer and/or a region is overdrawn for expressly illustration in the drawings. Further, it is appreciated that when an element or a layer is described to be on another element or another layer, the element or the layer may be formed directly on the another element, or a mediate layer may be located between them. In addition, it is understood that when an element or a layer is described to be under/below another element or another layer, the element or the layer may be formed directly under/below the another element or a mediate layer may be located between them. In addition, it is appreciated that when a layer or an element is described to be located between the two layers or two elements, it may be the only one between two layers or two elements or there are more than one layers or elements between the two layers or two elements. The same reference numbers are referred to similar elements throughout.

The technical terms or scientific terminologies used herein should be interpreted as the common meaning that those skilled in the art having the common technical ability understand, unless otherwise defined. The terms of "first", "second" or the like in the specification and claims of the present invention application are not intended to define any order, number or importance of the thing, instead of, only to distinguish different constituent parts.

The terms of "include" and "comprise" are intended to mean that the subject before this word should cover various objects listed after this word and theirs equivalents, instead of excluding other elements or items. The terms of "up", and "down" are only intended to indicate a relative positional relationship of the elements, which may be changed correspondingly when the absolute position of the described object is changed.

As shown in FIG. 1, there is provided a method of fabricating a graphene touch sensor according to an embodiment of the present disclosure, the method comprises the following steps:

Step S1: forming a graphene layer on a substrate;

Step S2: forming a metal layer on the graphene layer;

Step S3: coating a photoresist layer on the metal layer;

Step S4: exposing the photoresist layer by using a gray-scale reticle and developing the exposed photoresist layer to obtain a photoresist completely removed region, a photoresist partially remained region, and a photoresist completely remained region;

Step S5: removing the metal layer and the graphene layer located in the photoresist completely removed region;

Step S6: removing the metal layer located in the photoresist partially remained region;

Step S7: coating a protective film onto the graphene layer located in the photoresist partially remained region;

Step S8: striping off or peeling off the remainder photoresist.

In the embodiment, in the step S2, the metal layer may be formed by sputtering and depositing a metal on the graphene layer.

Preferably, if the photoresist is a positive photoresist in the step S3, then during exposure, the photoresist corresponding to the photoresist completely removed region is illuminated while the photoresist corresponding to the photoresist completely remained region is not illuminated. If the photoresist is a negative photoresist in step S3, then during exposure, the photoresist corresponding to the photoresist completely remained region is illuminated while the photoresist corresponding to the photoresist completely removed region is not illuminated.

In the embodiment, an alkaline developing solution is used in the step S4 for developing. As the metal layer is formed on the graphene layer, the graphene film or layer does not directly contact the alkaline developing solution and thus will not result in an increased square resistance caused by the contact with the alkaline developing solution. Thus, the problem in prior art that the conduction of the graphene layer is degraded may be solved and the yield of the product is increased.

It is noted that three regions are formed in the step S4: the photoresist completely removed region, the photoresist partially remained region and the photoresist completely remained region, wherein the metal layer under the photoresist partially remained region will be the resulting metal leading wire pattern and the graphene layer under the photoresist partially remained region is the resulting graphene layer pattern. Thus, a metal leading wire with high etching precision may be produced through this method according to the embodiment of the present disclosure, which may be used for the product with the narrow frame or with the ultra-narrow frame.

In the embodiment, the step S5 of removing the metal layer located in the photoresist completely removed region is specifically performed by wet etching the metal layer located in the photoresist completely removed region with an acid solution. After the step S5, a metal mask film for the metal leading wire and the graphene layer pattern will be formed thereby. Patterns of the graphene layer and the metal leading wire are formed by only one mask, thereby reducing the number of mask and decreasing the fabrication cost.

In the embodiment, the step S5 of removing the graphene layer located in the photoresist completely removed region specifically includes dry etching the graphene layer located in the photoresist completely removed region while ashing the photoresist layer in the photoresist partially remained region. Thus, the dry etching process and the ashing process are finished together in the step S5.

In the embodiment, the step S6 of removing the metal layer located in the photoresist partially remained region specifically comprises: wet etching the metal layer located in the photoresist partially remained region with an acid solution. The metal mask for the graphene layer pattern is removed in the step.

In the embodiment, the protective film used in the step S7 is made by a resin material. In the step S7, the protective film is wet coated onto the graphene layer pattern, so as to protect it, and increase the light transmission.

In the embodiment, the step S8 of striping the remainder photoresist specifically comprises: striping the remainder photoresist by an alkaline stripping solution. Thus, the step is done without the problem that the graphene film directly contacts the alkaline stripping solution and its square resistance is caused to increase and its electrically conduction becomes degraded, thereby increasing the yield.

Figure 2:
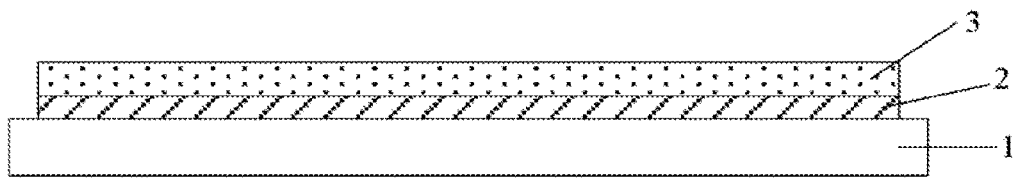
FIG. 2 is a schematic view of a structure after forming a graphene layer and a metal layer on a substrate according to an embodiment of the present disclosure.
Figure 3:
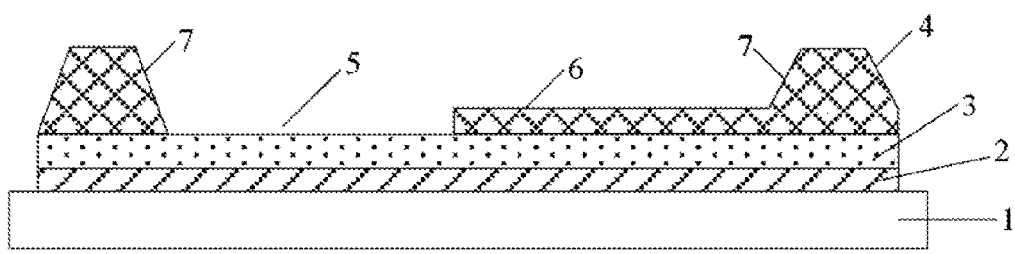
FIG. 3 is a schematic structural view of the structure after a process exposing photoresist by a gray-scale reticle according to the embodiment of the present disclosure.
Figure 4:
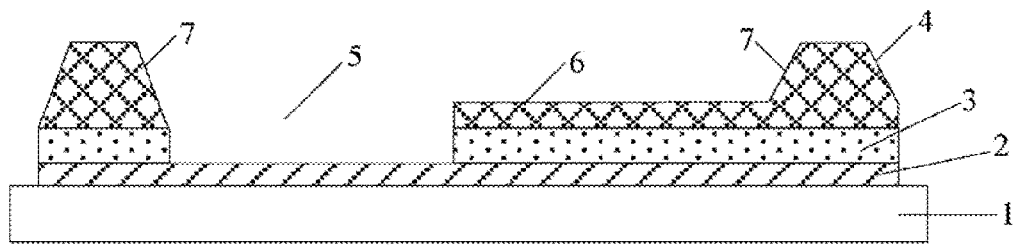
FIG. 4 is a schematic view of the structure according to the embodiment of the present disclosure, from which a part of metal layer is removed.
Figure 5:
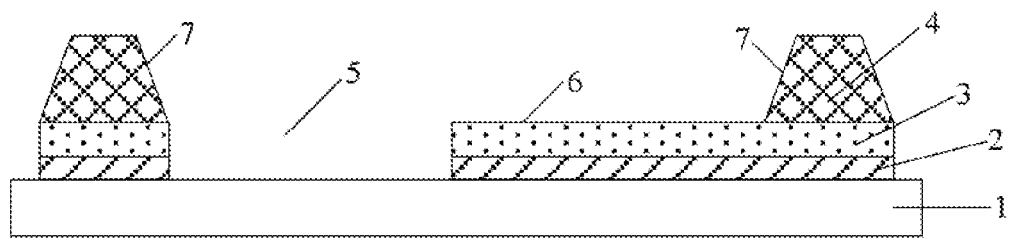
FIG. 5 is a schematic view of the structure according to the embodiment of the present disclosure, from which a part of a graphene layer is removed.
Figure 6:
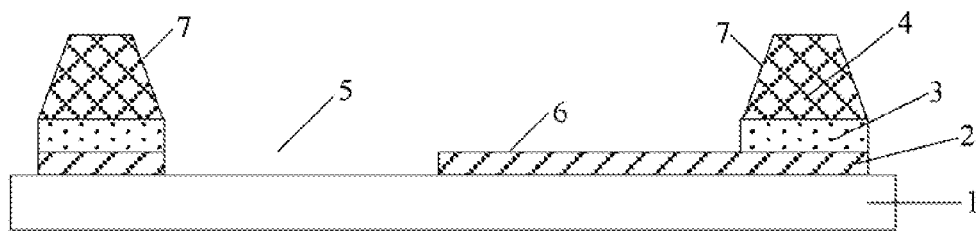
FIG. 6 is a schematic view of the structure according to the embodiment of the present disclosure, from which a part of a metal layer is removed.
Figure 7:
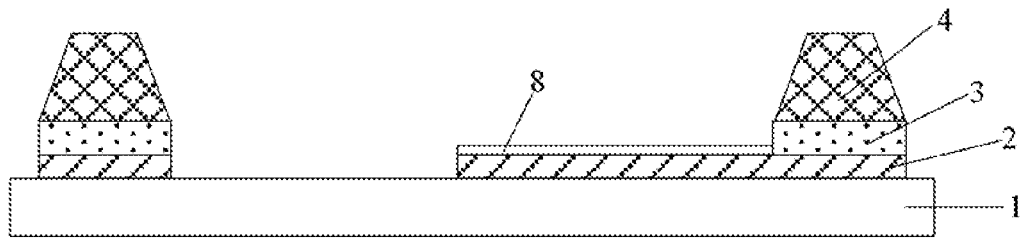
FIG. 7 is a schematic view of the structure according to the embodiment of the present disclosure, wherein a graphene pattern is coated by a protective film.
Figure 8:
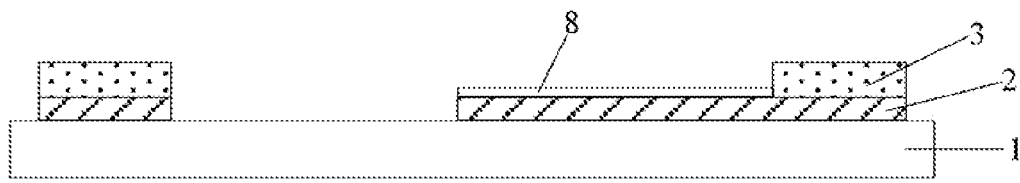
FIG. 8 is a schematic view of the structure according to the embodiment of the present disclosure, wherein the remainder photoresist is striped off.
Figure 9:
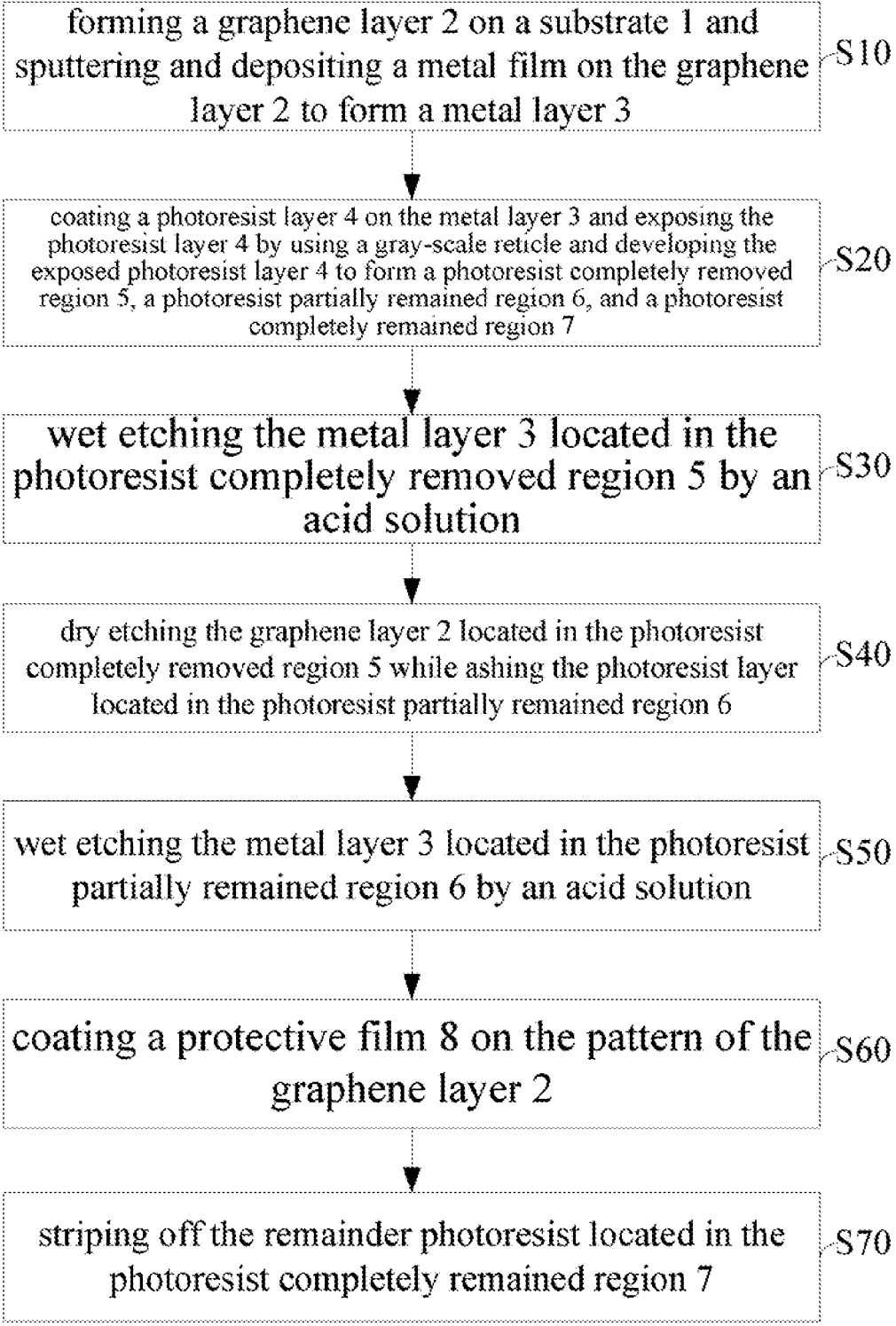
FIG. 9 is a schematic flow chart of a method of fabricating a graphene sensor according to an embodiment of the present disclosure.

A fabricating method according to an embodiment of the present disclosure is illustrated by reference to the schematic cross-sectional views of device structures formed in various steps shown in FIGS. 2 to 8. The method according to the embodiment may include the steps as below:

Step S10: forming a graphene layer 2 on a substrate 1 and sputtering and depositing a metal film on the graphene layer 2 to form a metal layer 3, as shown in FIG. 2;

Step S20: coating a photoresist layer 4 on the metal layer 3 and exposing the photoresist layer 4 by using a gray-scale reticle and developing the exposed photoresist layer 4 to form a photoresist completely removed region 5, a photoresist partially remained region 6, and a photoresist completely remained region 7, as shown in FIG. 3;

Step S30: wet etching the metal layer 3 located in the photoresist completely removed region 5 by an acid solution, as shown in FIG. 4;

Step S40: dry etching the graphene layer 2 located in the photoresist completely removed region 5 while ashing the photoresist layer located in the photoresist partially remained region 6, as shown in FIG. 5;

Step S50: wet etching the metal layer 3 located in the photoresist partially remained region 6 by an acid solution, as shown in FIG. 6;

Step S60: coating a protective film 8 on the pattern of the graphene layer 2, as shown in FIG. 7;

Step S70: striping off the remainder photoresist located in the photoresist completely remained region 7, as shown in FIG. 8.

It is appreciated by those skilled in the art that the above illustrated steps correspond to the steps in the embodiment described in combination with FIG. 1, in which the step S10 is a combination of the step S1 and the step S2.

Based on the method of fabricating a graphene touch sensor according to the present disclosure, it avoids the problem that the alkaline developing solution and the alkaline stripping solution during a lithographic process contact the graphene film and the electrical conductivity of the graphene film becomes degraded, by introducing a gray-scale mask lithographic technology and a technique of using the metal layer as a lithographic mask of the graphene film. In addition, it also increases the yield, and a method of fabricating a graphene touch screen by the lithographic technology becomes feasible. Meanwhile, it reduces the number of used masks/reticles and thus reduces the production cost, and facilitates to obtain metal leading wire electrodes with high etching precision for a product with a narrow/ultra-narrow frame.

Another embodiment of the present invention provides a graphene sensor fabricated by the method according to any of the above embodiments. For example, as shown in FIG. 8, the graphene sensor includes a substrate 1, a pattern of a graphene layer 2 formed on the substrate 1 and a metal leading wire 3 formed on the pattern of the graphene layer 2.

Another yet embodiment of the present invention provides a touch-sensitive display device, comprising the graphene sensor according to the above embodiments. The graphene sensor fabricated according to the above method may be used to produce a touch-sensitive display device that has a big size and a narrow frame and is ultra-lightweight and ultra-thin.

It should be understood that the above description is merely used to illustrate specific embodiments of the present invention, but not to limit the present invention. Any changes, equivalent replacements, modifications within the spirit and principles of the disclosure can be made by those skilled in the art and should fall into the scope of the disclosure, if these changes and modifications belong to scope of the claims of the appended claims and their equivalents, and would not make the obtained corresponding technical scheme detach from the spirit and principles of the embodiments of the present disclosure.

What is claimed is:

1. A method of fabricating a graphene touch sensor, comprising forming a graphene layer on a substrate;

forming a metal layer on the graphene layer;

coating a photoresist layer on the metal layer;

exposing the photoresist layer by using a gray-scale reticle and developing the exposed photoresist layer to obtain a photoresist completely removed region, a photoresist partially remained region, and a photoresist completely remained region;

removing the metal layer located in the photoresist completely removed region;

removing the graphene layer located in the photoresist completely removed region;

removing the metal layer located in the photoresist partially remained region;

coating a protective film on the graphene layer located in the photoresist partially remained region; and striping off the remainder photoresist.

2. The method according to claim 1, wherein the photoresist is a positive photoresist, and wherein during exposure, the photoresist in the photoresist completely removed region is illuminated while the photoresist in the photoresist completely remained region is not illuminated.

3. The method according to claim 1, wherein the photoresist is a negative photoresist, and wherein during exposure, the photoresist in the photoresist completely remained region is illuminated while the photoresist in the photoresist completely removed region is not illuminated.

4. The method according to claim 1, wherein the step of removing the metal layer located in the photoresist completely removed region comprises: wet etching the metal layer located in the photoresist completely removed region by an acid solution.

5. The method according to claim 1, wherein the step of removing the graphene layer located in the photoresist completely removed region comprises: dry etching the graphene layer located in the photoresist completely removed region while ashing the photoresist layer in the photoresist partially remained region.

6. The method according to claim 1, wherein the step of removing the metal layer located in the photoresist partially remained region comprises: wet etching the metal layer located in the photoresist partially remained region by an acid solution.

7. The method according to claim 1, wherein the protective film is made by a resin material.

8. The method according to claim 1, wherein the step of striping off the remainder photoresist comprises: striping off the remainder photoresist by an alkaline stripping solution.

9. A graphene sensor fabricated by the method of according to claim 1, comprising a substrate, a pattern of a graphene layer formed on the substrate and a metal leading wire formed on the pattern of the graphene layer.

10. A touch-sensitive display device, comprising the graphene sensor according to claim 9.

* * * * *